(12) United States Patent
Grosso et al.

(10) Patent No.: US 12,242,184 B2
(45) Date of Patent: Mar. 4, 2025

(54) NANOIMPRINT LITHOGRAPHY PROCESS AND PATTERNED SUBSTRATE OBTAINABLE THEREFROM

(71) Applicants: UNIVERSITE D'AIX-MARSEILLE, Marseilles (FR); CENTRE NATIONAL DE LA RECHERCHE SCIENTIFIQUE, Paris (FR); SORBONNE UNIVERSITE, Paris (FR); UNIVERSITE PARIS-SACLAY, Gif-sur-Yvette (FR)

(72) Inventors: David Grosso, Allauch (FR); Marco Faustini, Paris (FR); Olivier Dalstein, Paris (FR); Andréa Cattoni, Rosate (IT); Thomas Bottein, Talence (FR)

(73) Assignees: UNIVERSITE D'AIX-MARSEILLE, Marseilles (FR); CENTRE NATIONAL DE LA RECHERCHE SCIENTIFIQUE, Paris (FR); SORBONNE UNIVERSITE, Paris (FR); UNIVERSITE PARIS-SACLAY, Gif-sur-Yvette (FR)

(*) Notice: Subject to any disclaimer, the term of this patent is extended or adjusted under 35 U.S.C. 154(b) by 274 days.

(21) Appl. No.: 16/494,607

(22) PCT Filed: Mar. 8, 2018

(86) PCT No.: PCT/EP2018/055825
§ 371 (c)(1),
(2) Date: Sep. 16, 2019

(87) PCT Pub. No.: WO2018/166896
PCT Pub. Date: Sep. 20, 2018

(65) Prior Publication Data
US 2020/0218147 A1  Jul. 9, 2020

(30) Foreign Application Priority Data

Mar. 16, 2017 (EP) .................................. 17305286

(51) Int. Cl.
*G03F 7/00* (2006.01)
*B22D 21/00* (2006.01)
(Continued)

(52) U.S. Cl.
CPC .......... *G03F 7/0002* (2013.01); *B22D 21/005* (2013.01); *B82Y 30/00* (2013.01); *B82Y 40/00* (2013.01)

(58) Field of Classification Search
CPC ........... Y10S 977/887; B81C 2201/015; B81C 2201/0152; B81C 2201/0153; G03F 7/0002; G02B 2207/109
See application file for complete search history.

(56) References Cited

U.S. PATENT DOCUMENTS 6,355,198 B1   3/2002  Kim et al.
7,994,053 B2   8/2011  Park et al.
(Continued)

FOREIGN PATENT DOCUMENTS

JP   2011-51875 A    3/2011
JP   2015-191787 A   11/2015

OTHER PUBLICATIONS

Andrea Radivo et al., RSC Adv., 2014, 4, 34014-34025 (Year: 2014).*

(Continued)

*Primary Examiner* — Tabassom Tadayyon Eslami
(74) *Attorney, Agent, or Firm* — SALIWANCHIK, LLOYD & EISENSCHENK (57) ABSTRACT

The present invention pertains to the field of nanoimprint lithography (NIL) processes and more specifically to a soft
(Continued)

NIL process used for providing a sol-gel patterned layer on a substrate. Specifically, this process comprises a step of adjusting the solvent uptake of the sol-gel film to 10 to 50% vol., preferably between 15 and 40% vol., by varying the relative pressure of the solvent while a soft mould is applied onto the substrate coated with the sol-gel film.

15 Claims, 6 Drawing Sheets

(51) Int. Cl.
  *B82Y 30/00* (2011.01)
  *B82Y 40/00* (2011.01)

(56) References Cited

U.S. PATENT DOCUMENTS

| | | | |
|---|---|---|---|
| 11,112,692 B2 | 9/2021 | Grosso et al. | |
| 2009/0026658 A1 | 1/2009 | Hosoda et al. | |
| 2009/0098340 A1 | 4/2009 | Campos et al. | |
| 2010/0109201 A1 | 5/2010 | Fletcher et al. | |
| 2011/0039079 A1* | 2/2011 | Bockmeyer | H01L 51/5275 428/195.1 |
| 2011/0148008 A1 | 6/2011 | Guo et al. | |
| 2011/0156320 A1 | 6/2011 | Chen et al. | |
| 2012/0258292 A1 | 10/2012 | Lenhert et al. | |
| 2012/0306122 A1 | 12/2012 | Hoshino | |
| 2013/0078796 A1 | 3/2013 | Ganesan et al. | |
| 2014/0357012 A1* | 12/2014 | Toriyama | B29D 11/00326 216/13 |
| 2016/0214312 A1 | 7/2016 | Hirano | |
| 2019/0243237 A1* | 8/2019 | Watkins | C09D 11/52 |
| 2020/0174363 A1 | 6/2020 | Grosso et al. | |

OTHER PUBLICATIONS

Dalstein et al., "Nanoimprinted, submicrometric, MOF-based 2D photonic structures: toward easy selective vapors sensing by a smartphone camera," Adv Funct Mater. 26(1): 81-90 (2016).

International Search Report and Written Opinion for International Patent Application No. PCT/EP2018/055825, mailed Jun. 11, 2018 (14 pages).

Kothari et al., "Direct patterning of robust one-dimensional, two-dimensional, and three-dimensional crystalline metal oxide nanostructures using imprint lithography and nanoparticle dispersion inks," Chem Mater. 29(9): 3908-3918 (2017).

Radivo et al., "Patterning PEDOT:PSS and tailoring its electronic properties by water-vapour-assisted nanoimprint lithography," RSC Adv. 4(64): 34014-34025 (2014).

* cited by examiner

NANOIMPRINT LITHOGRAPHY PROCESS AND PATTERNED SUBSTRATE OBTAINABLE THEREFROM

The present invention pertains to the field of nanoimprint lithography (NIL) processes and more specifically to a soft NIL process used for providing a sol-gel patterned layer on a substrate.

BACKGROUND OF THE INVENTION

Nanolithography was developed rather recently to replicate masters at the nanoscale with the view to producing high-density optical and magnetic storage media, organic light-emitting diodes, polymer photovoltaic cells and field-effect transistors, for instance. A number of existing nanopatterning technologies such as electron beam lithography (ELB), optical lithography, interference lithography (IL), etc., cannot cope with all the practical demands of industrial applications with respect to high resolution, high throughput, low cost, large area, and patterning on non-flat and curved surface.

Nanoimprint lithography (NIL), including thermal NIL (or hot embossing) and UV NIL, has been considered as a promising nanopatterning method for satisfying the above needs, based on the mechanical embossing principle.

Among NIL techniques, soft-nanoimprint lithography (soft-NIL) specifically uses soft elastomeric stamps (i.e. moulds) replicated from hard masters, and can generate patterns with superior resolutions ($\approx$10 nm) than conventional optical lithography techniques, limited by either light diffusion or diffraction and with high throughput. In conventional soft-NIL, imprinted materials are thermoplastics or UV-curable liquid resists, as they can change viscosity with UV exposure or with temperature making the templating and demoulding easier. An example of such a thermal soft-NIL technique using polymeric materials was disclosed by Htay Hlaing et al. (*Small*, 2012, 8, No. 22, 3443-3447) which report the manufacture of a PEDOT:PSS patterned film. It was noted that the combination of sample heating and water-vapor improved the nanoimprinting quality of the film over conventional thermal nanoimprinting. In particular, the humid environment is said to provide for water absorption in the polymer film and to ensure complete filling of the master template cavities. Moreover, elevated temperatures were said to soften the PEDOT domains, which is required for obtaining a high pattern fidelity.

On the other hand, only a few works attempted the soft-NIL process on sol-gel materials (ZnO, ITO, PZT and finally $TiO_2$), all underlining the high potential but the great difficulties, intrinsic to the involved chemistries of hydrolysis condensation. The first example reporting the embossing of $TiO_2$ xerogel was performed at high temperature and pressure (200° C., 5 bar) making objects with low aspect ratios (K. min Yoon, K. yeon Yang, H. Lee, *Thin Solid Films* 2009, 518, 126). In order to imprint sol-gel films in the mild conditions of soft-NIL, most studies uses polymeric or organic molecules to adjust the rheology and obtain good resolution and aspect ratios but with very strong shrinkage (W.-S. Kim, K. B. Yoon, B.-S. Bae, *J. Mater. Chem.* 2005, 15, 4535. D. a. Richmond, Q. Zhang, G. Cao, D. N. Weiss, *J. Vac. Sci. Technol. B Microelectron. Nanom. Struct.* 2011, 29, 21603. C. Peroz, V. Chauveau, E. Barthel, E. Sndergård, *Adv. Mater.* 2009, 21, 555. H. H. Park, D. G. Choi, X. Zhang, S. Jeon, S. J. Park, S. W. Lee, S. Kim, K. D. Kim, J. H. Choi, J).

An example of a soft-NIL process using sol-gel materials was described by O. Dalstein et al. (*Adv. Funct. Mater.* 2015, 26, 81). These authors showed that a complex system can be implemented by imprinting hybrid nanostructures, for instance diffraction gratings, from a blend of ZIF8 and $TiO_2$. For this purpose, ZIF8 was deposited on nanoimprinted $TiO_2$ gratings which were themselves obtained by applying a degassed PDMS stamp to a sol-gel film of titanium oxide precursor deposited under 40% RH.

To the best of the inventors' knowledge, it has not been suggested yet that adjusting the water-vapor pressure during soft-NIL of sol-gel systems could improve the resolution of the pattern thus obtained. Although water vapor was found by Htay Hlaing et al. to improve pattern quality in the case of a thermal soft-NIL process by increasing water uptake by the polymeric material used, there was a prejudice towards the extrapolation of this finding to sol-gel materials. This is because water is thought to remain entrapped in the imprinted structures produced from sol-gel films, resulting in poor demoulding and incomplete filling of the material inside the mould. Other methods were thus proposed to improved pattern quality of soft-NIL processes using sol-gel materials. Apart from their cost and complexity, these methods however lead to shrinkage of the structures thus obtained with respect to the original mould size, which is not acceptable (Ramakrishnan Ganesan et al., *Nanotechnology*, 2012, 23, 315304).

SUMMARY

In view of the above, there remains the need to provide a soft-NIL process which allows imprinting sol-gel materials under mild pressure and temperature conditions (especially ambient pressure and temperature) with patterns providing accurate master replication (with sub-micrometric accuracy) and possibly high aspects ratios (>1) with low volume shrinkage.

The inventors have shown that this need may be satisfied by adjusting the solvent vapor pressure during the soft-NIL process.

This invention is thus directed to a nanoimprint lithography (NIL) process, comprising the successive steps of:

a) preparing a solution of metal or metalloid oxide precursor(s), b) applying said solution onto a substrate to form a film, c) equilibrating the film with the atmosphere under adjusted solvent vapor pressure, d) applying a soft mould onto said film to provide an assembly such that said film fills up the cavities of the mould, and maintaining said assembly under solvent vapor, e) thermally treating said assembly so as to rigidify the gel film thus obtained, f) removing the mould to obtain a substrate coated with a patterned gel, and g) curing said patterned gel so as to obtain a patterned metal or metalloid oxide material on said substrate, characterized in that the solvent uptake of the film is adjusted to 10 to 50% vol., preferably between 15 and 40% vol., by varying the vapor pressure in a volatile solvent at the vicinity of the gel during steps c) and d).

It also pertains to the patterned substrate obtainable by the above process and to the use of this patterned substrate for manufacturing devices for optical, photonic, electrical or biological applications.

DETAILED DESCRIPTION

The process according to this invention comprises a first step of preparing a solution of metal or metalloid oxide precursor(s) onto a substrate.

The expression "metal oxide precursor(s)" refers to any metal oxide precursor, metalloid oxide precursor or combination thereof, which is conventionally used in sol-gel processes. The precursors may for instance be selected from the group consisting of inorganic salts, organics salts or alkoxides of at least one metal or metalloid or of a combination of at least one metal with at least one metalloid. Examples of inorganic salts are halides (fluorides, chlorides, bromides or iodides, especially chlorides), oxychlorides and nitrates. Organic salts may be selected from oxalates and acetates, for instance, while alkoxides are typically of formula $(RO)_nM$ where M denotes the metal or metalloid, n represents the number of ligands linked to M which corresponds to the valency of M and R represents a linear or branched alkyl chain having from 1 to 10 carbon atoms or a phenyl group; organometallic compounds of formula $X_yR^1_zM$ wherein M represents a metal or metalloid, X represents a hydrolysable group chosen from halogen, acrylate, acetoxy, acyl or OR' group where R' is a linear or branched alkyl group comprising from 1 to 10 carbon atoms or a phenyl group, $R^1$ represents a non-hydrolysable group selected from optionally perfluorinated linear or branched alkyl groups comprising from 1 to 10 carbon atoms or a phenyl group, and y and z are integers chosen so that y+z is equal to the valency of M. The metals may be selected from titanium, hafnium, zirconium, aluminum, copper, iron, scandium, vanadium, chromium, manganese, cobalt, nickel, copper, yttrium, niobium, molybdenum, technetium, ruthenium, rhodium, palladium, silver, tantalum, tungsten, rhenium, osmium, iridium, platinum, gold, rutherfordium, dubnium, seaborgium, bohrium, hassium, copernicium, cerium, erbium, europium, gadolinium, holmium, lanthanum, lutetium, neodymium, praseodymium, promethium, samarium, scandium, terbium, thulium, ytterbium, yttrium and their mixtures thereof, whereas suitable metalloids include for instance silicon, selenium and tellurium. Examples of silicon precursors are tetraethoxysilane (TEOS), tetramethoxysilane (TMOS), tetrapropoxysilane, methyltriethoxysilane, dimethyldimethoxysilane, allyltrimethoxysilane, propyltriethoxysilane, phenyltriethoxysilane, 1,4-bis(triethoxysilyl) benzene, vinyltriethoxysilane, phenylaminomethyltriethoxysilane (PAMS), triethoxysilane, triethoxy(octyl)silane, methyltrimethoxysilane, phenyltrimethoxysilane and methyltriisopropoxysilane, preferably tetraethoxysilane (TEOS); examples of titanium precursors are $TiCl_4$, $Ti(OiPr)_4$, $Ti(NO_3)_4$, $Ti(SO_4)_2$ and titanium acetate.

The metal or metalloid precursors may further be present in a hydrated form.

Examples of metal or metalloid oxides which can be obtained from the metal or metalloid oxide precursors are $TiO_2$, $ZnO:TiO_2$, $AlO(OH)$, $V_2O_5$, $VO_2$, or any silicon oxides.

A combination of at least two silicon precursors may be used, preferably a combination of tetraethoxysilane (TEOS) and methyltriethoxysilane.

Precursors of different metals or metalloids or precursors of a combination of at least one metal with at least one metalloid may be used, to obtain ceramics in the form of complex oxides with a defined stoechiometry, such as $Y-ZrO_2$.

To form the solution used in this invention, the precursors are typically combined with a solvent selected from water, mono- or dihydric alcohols, such as methanol, ethanol, n-propanol, ethylene glycol, propylene glycol or a mixture thereof. Water combined with organic solvent(s) is generally used in the case of inorganic precursors and organometallic precursors. In the former situation, ethanol is preferably present in the solution in order to improve the wetting of the substrate, disperse the precursors and reduce the kinetics of their hydrolysis to avoid crosslinking. The solution may additionally comprise a catalyst, which may be selected from basic catalysts (such as $NH_3$) and acidic catalysts, preferably a small and volatile acid (such as acetic acid or hydrochloric acid), less preferably a non-volatile acid (such as nitric acid). It may further comprise one or more polymers, intended for instance to form mesopores in the metal or metalloid oxide film or to improve its homogeneity, such as amphiphilic block copolymers.

The solution may also comprise surfactants, such as a cationic surfactant, to stabilize the colloidal solution or "sol" formed after hydrolysis and polymerization of the precursors.

Chelating agents may further be provided in the solution, although not needed according to this invention. It has indeed been shown that the mobility of the sol-gel film into the recesses of the mould is high enough according to the process provided herein, such that it does not need to be adjusted by chelating agents.

This solution may be applied to the substrate by any appropriate means, including by dip-coating, spin-coating or spray-coating, preferably by dip-coating, so as to form a layer having a thickness of from 5 nm to several microns, preferably from 20 to 200 nm. The substrate onto which the sol-gel layer is deposited may be for instance selected from glass, metal or polymeric substrates. Examples of polymers that may be used in the substrate include polyimide, polycarbonate and polyester (such as polymethyl methacrylate) substrates. The film thickness may be adjusted by controlling the deposition conditions (dip-coating withdrawal rate; spin-coating revolution rate) and the solution viscosity and concentration.

The process of this invention then comprises a step of forming a gel from the metal or metalloid oxide precursors to obtain a gel film coated on the substrate. Said gel is formed by hydrolysis and polymerization of said precursors. Hydrolysis may start spontaneously in case the sol-gel solution comprises water or when the metal or metalloid precursors are in the form of hydrates. Polymerization may be delayed in case the solution comprises an acidic catalyst. In any case, the gel is formed under solvent vapor to allow adsorption and/or absorption of the solvent into the film up to equilibrium.

A soft mould is then applied onto said coated substrate to provide an assembly such that said film fills up the cavities of the mould.

This mould is typically obtained as a negative copy from a master template. The master template itself may be firstly fabricated from silicon or any other suitable material such as glass, metal oxide(s), polymers, hybrid materials and composite materials. It may be manufactured by electron beam lithography (EBL), Focused Ion Beam lithography (FIB) or any other suitable patterning technology. Then, the surface of the master may be treated to form an anti-adhesive layer thereon. The liquid mould material may then be spin coated or casted into the master template to duplicate a patterning layer. The material is usually degassed in a low pressure vacuum chamber. Subsequently, a backplane or a flexible layer may be bonded to the patterned layer. Thermal or UV curing is then generally performed in order to reduce roughness and to avoid a build-up of tension because of thermal shrinkage. The replicated mould is left to cool to room temperature and carefully peeled off from the master template.

According to a preferred embodiment of this invention, the mould is degassed before demoulding from the master template, for instance in a pumped dessicator.

Examples of materials that may be used for the manufacture of the mould are silicone elastomers (crosslinked polysiloxanes) that may be obtained by mixing a polysiloxane bearing reactive (such as hydride or vinyl) groups with a crosslinking silicone oligomer. Such moulds are usually referred to as "PDMS moulds". Other materials that may be used for the manufacture of the soft mould are fluorinated polymers, such as perfluoropolyether (PFPE) and its derivatives, including HPFPE which is a copolymer resin of a perfluoropolyether (PFPE) and a hyperbranched polymer (HP), acryloxy PFPE (denoted as a-PFPE) or a-,w-methacryloxy functionalized PFPE (PFPE-DMA); and tetrafluoroethylene and its derivatives, including ETFE (which is a copolymer of ethylene and tetrafluoroethylene) and copolymers of 2,2-bistrifluoromethyl-4,5-difluoro-1,3-dioxole and tetrafluoroethylene. Other suitable materials may be selected from polyvinylpyrrolidone (PVP), polylactic acid (PLA) and polyetherimide (PEI), for instance.

A key feature of this invention is that the replication step conducted by applying the mould onto the film is performed under solvent vapor and that the solvent uptake of the sol-gel film is adjusted to 10 to 50% vol., preferably to 5 to 40% vol., for instance to 25-35% vol., by varying the relative pressure of the solvent. The mould has typically been degassed a few minutes before the replication step and its porosity is thus empty enough to act as a "sponge" which pumps the solvent contained into the sol-gel film while the resist sol-gel is sucked inside the protrusions of the mould. There is thus no need to apply high pressure to the mould during replication. Specifically, according to a preferred embodiment of this invention, the pressure applied to the mould during the replication step described above that of the weight of the mould only (i.e. typically less than 10 g/cm$^2$), so as to limit short-range deformations in the nanostructures formed from the film. Thus, no additional pressure is applied to the mould.

In order to reach the above uptake values, a calibration step is usually performed before conducting the process of this invention. For this purpose, the film is deposited on the substrate as described before, and placed in a chamber supplied with a dry air flow and a mixed flow of air and solvent. The solvent is a volatile solvent that may be selected from water, ethanol, isopropanol, acetone, THF, hexane, toluene and any other suitable solvent. The solvent relative pressure is varied by changing the relative flow rates of dry air and air/solvent ($P/P_o$=1) and the volume of the film is measured for each value of the relative pressure by any appropriate means, such as by ellipsometry. A curve is thus plotted, which may be used while conducting the process of this invention to determine the solvent relative pressure that should be applied during the replication step.

Importantly, the process of this invention is conducted, until this point, under mild pressure and temperature conditions, especially ambient pressure and temperature.

In the next step of the process according to this invention, the assembly formed by the mould and the coated substrate is then thermally treated. The duration and temperature of this thermal treatment may be adjusted to any suitable range for obtaining a gelled film which displays preference adherence to the substrate compared to the mould and sufficient rigidification to avoid collapsing of the pattern after unmoulding. Depending on the constituents of the sol-gel solution, the treatment may for instance be performed at a temperature of from 25 to 200° C. for typically between 1 to 10 minutes. This drying step also allows the evaporation of part of the solvent present in the gel, further promoting its condensation.

The mould is then removed to obtain a substrate coated with a patterned gel which may have started to solidify and this gel is further densified by curing so as to obtain a patterned metal or metalloid oxide material on said substrate. This curing (or annealing) step results in a complete removal of the solvent present in the colloidal solution, of the solvent absorbed by the film and of the organic by-products generated by the precursors and of the polymer(s) that may be present in the sol-gel solution. The duration and temperature of this curing treatment may be adjusted to any suitable range, depending on the constituents of the colloidal solution, so as to obtain constant dimensions of the pattern and for instance from 200 to 800° C. The obtained patterned metal or metalloid oxide material on said substrate may be subjected to any further chemical and/or physical treatment aiming at modifying the nature of the metal or metalloid oxide. For example, a $V_2O_5$ oxide material may be reduced into a $VO_2$ oxide material at 500 ° C. for 4 hours under an atmosphere composed of 5% H2 in $N_2$.

In a particular embodiment, the process according to the invention comprises a step (a') of converting the metal or the metalloid oxide precursors into a metal or metalloid oxide suspension after step (a) and before step (b), and does or does not comprise step (g). Such process comprises the successive steps of:

a) preparing a solution of metal or metalloid oxide precursor(s), a') converting said metal or metalloid oxide precursors into a metal or metalloid oxide suspension in solution, b) applying said solution onto a substrate to form a film, c) equilibrating the film with the atmosphere under adjusted solvent vapor pressure, d) applying a soft mould onto said film to provide an assembly such that said film fills up the cavities of the mould, and maintaining said assembly under solvent vapor, e) thermally treating said assembly so as to rigidify the gel film thus obtained, and f) removing the mould to obtain a substrate coated with a patterned gel, g) optionally curing said patterned gel so as to obtain a patterned metal or metalloid oxide material on said substrate.

The duration and temperature of step (a') may be adjusted to any suitable range, depending on the constituents of the colloidal solution. Step (a') may be carried out at room temperature. Step (a') may also be carried out under hydrothermal conditions.

The patterned substrate thus obtained may be used in various applications and in particular for manufacturing devices for optical, photonic, electrical or biological applications. Among such applications, mention can be made of, for instance, solar cells for photovoltaic devices; photonic crystals for photonic crystal fibers, optical waveguides, laser emission or optical sensors; anti-reflection coatings for optical devices; or photocatalysis.

EXAMPLES

This invention will be better understood in light of the following examples which are given for illustrative purposes only and do not intend to limit the scope of the invention, which is defined by the attached claims.

Example 1: Soft-NIL Method Applied to a $TiO_2$ Film Under Relative Humidity

A master was manufactured by Focused Ion Beam lithography of a silicon wafer. Two types of patterns were used:
pyramid arrays which were obtained by engraving parallel lines spaced by 1 µm, then lines perpendicular thereto, on an area of 20 µm×20 µm. The depth of the engraving could not be measured (destructive method)
plots of 1.8 µm diameter surrounded by an engraved area of 4 µm diameter and 700 nm depth, which were obtained by engraving rings in the master.

A negative of this master was then prepared by moulding from a silicone elastomer (PDMS) material. For this purpose, the master was first immersed in an ethanoic solution of 0.05 M of $SiCl_2(CH_3)_2$ during 30 min, then withdrawn from the solution and abundantly rinsed with ethanol. The PDMS precursors (90% by weight Rhodorsil® RTV141A, 10% RTV141B) were mixed then poured onto the master. After degassing, the PDMS was annealed at 120° C. for 1 h then demoulded. The mould was degassed for 10 min just before the replication step.

A sol-gel solution consisting of 2.5 g of $TiCl_4$, 42 g ethanol, 1.3 g $H_2O$ and 0.1 g of Pluronic® F127 (PPG-PEG copolymer) was placed onto a defatted glass slide (VWR®) by dip-coating in controlled chamber (v=2 mm/s, T=25° C., RH=20%). Shortly after dip-coating, the glass slide was placed into a chamber with controlled atmosphere, onto a cold heating plate. The gas relative pressure was precisely controlled and maintained for 1 min, then the mould was applied onto the film and kept for 5 min under controlled humidity. This assembly was then heated to 120° C. for 5 min (including 2 min of heating time to 120° C.). The substrate was finally demoulded and annealed at 500° C. in order to crystallize $TiO_2$ into its anatase form.

1—Influence of Humidity on Film Mobility

Figure 1:
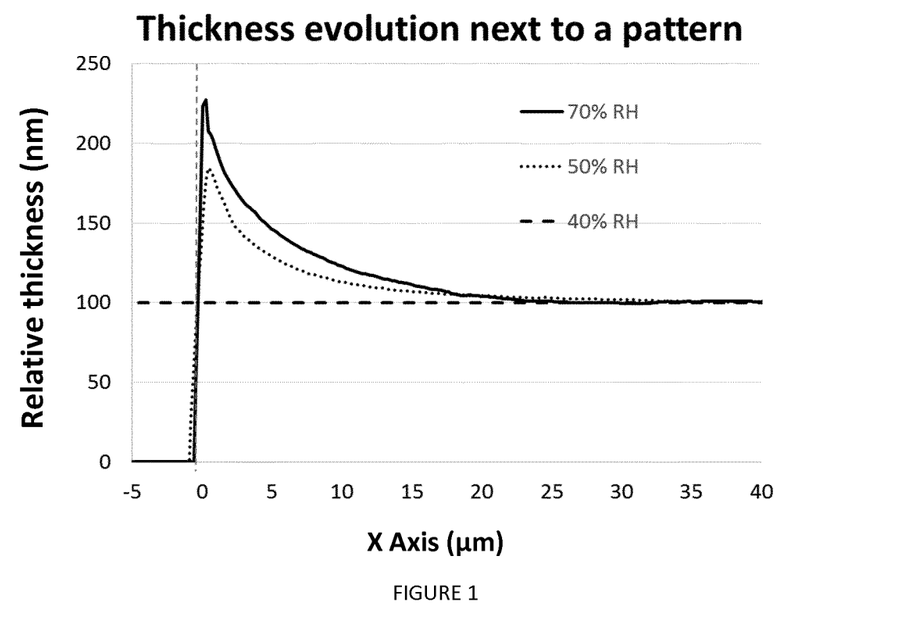
FIG. 1 represents the thickness evolution of a $TiO_2$ film next to a pattern, when a mould is applied onto the film, when varying the relative humidity.

A preliminary experiment is first conducted by measuring with an Atomic Force Microscope the change in film thickness close to one of the patterns present on the mould. For this purpose, a precise control of water relative pressure (i.e. relative humidity, RH) is performed. When the mould is applied to the surface of the film, the capillary forces between the film and the PDMS surface induce a local deformation and are responsible for the displacement of the material around the patterns. This experiment showed that the film has no mobility at RH<40%. The film mobility increases gradually when the process is conducted at RH=50% then at RH=70%, as shown on FIG. 1. The sol-gel fil thus displays some mobility which may be controlled by adjusting relative humidity during the replication step of the soft-NIL process.

2—Optimization of Relative Humidity in the Case of a TiO2 Film

Figure 2:
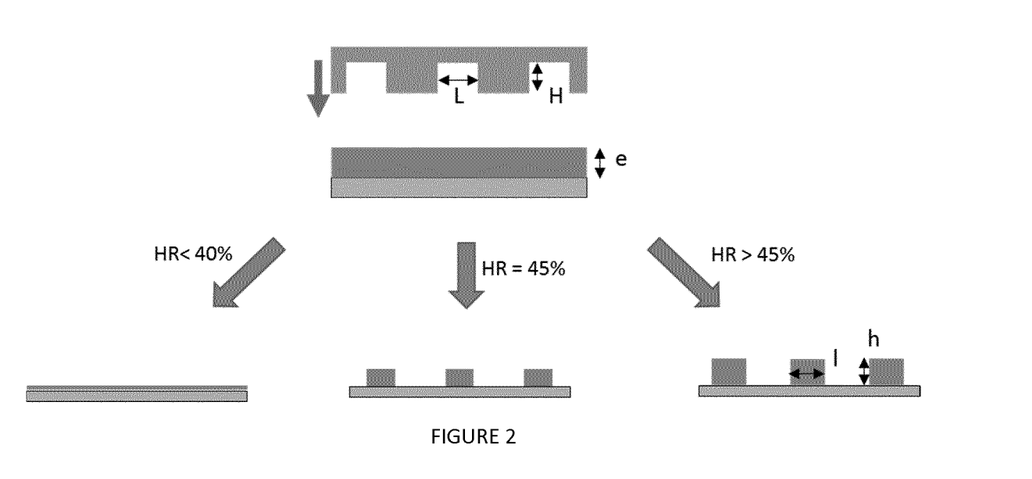
FIG. 2 shows the replicas obtained from the same $TiO_2$ film under various relative humidities.

The effect of relative humidity on the replication of structures has been studied. The patterns engraved on the master were replicated on the mould then on sol-gel samples and the samples were characterized by dark field optical microscopy and by atomic force microscopy in order to assess the accuracy of pattern replication between the master and the replica. In addition to accurate replication, an aspect ratio as close as possible to that of the master is desired, as shown on FIG. 2 where Z designates the aspect ratio, which corresponds to the height (H or h) of the pillars to their diameter (L or l, respectively). It is preferred that h/l be as close as possible to H/L.

Figure 3:
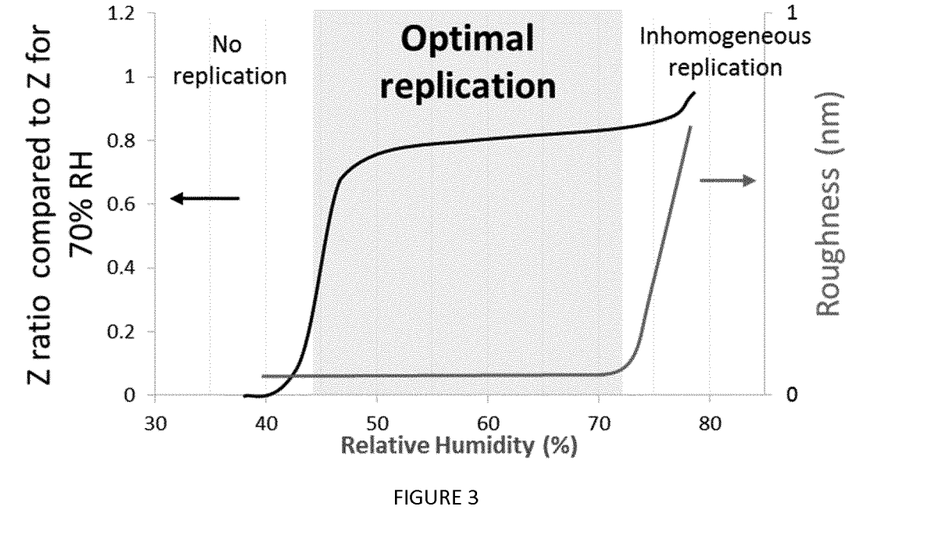
FIG. 3 illustrates the variation in the aspect ratio and surface roughness of the same $TiO_2$ film when varying the relative humidity.

As shown on FIG. 3, the aspect ratio increases with relative humidity. Mobility thus increases together with the amount of water absorbed by the film. Below 45% RH, mobility is not high enough and no replication occurs. Moreover, for patterns obtained at RH>70%, a high surface roughness is observed, as well as cracks in the sol-gel layer. During the consolidation process of the sol-gel layer, the temperature increase (from 25 to 120° C.) indeed results in the evaporation of volatile species (such as water and ethanol) through the PDMS mould. Since the latter is permeable to gases, it is likely that the excess of absorbed water (related to RH) is such that the volatile species cannot escape fast enough, which accounts for surface roughness and cracks on the edge of the pattern.

Figure 4:
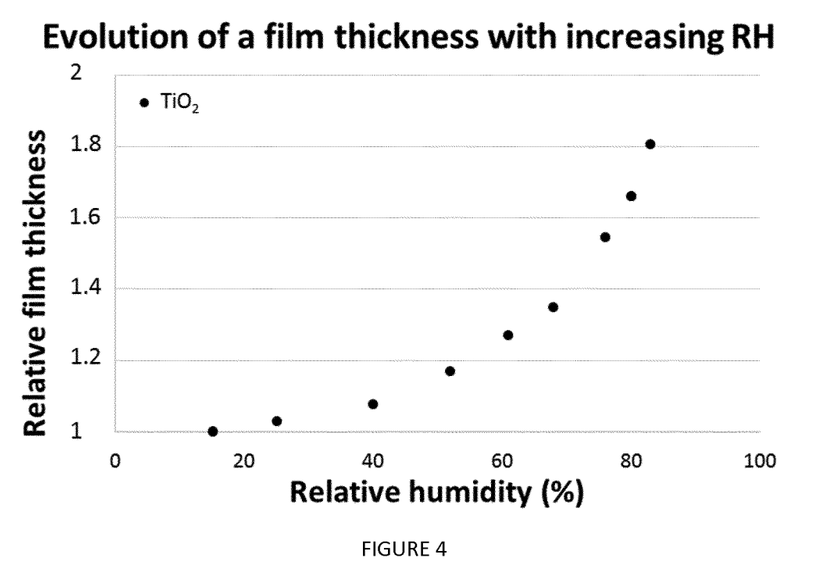
FIG. 4 illustrates the thickness variation of a $TiO_2$ film as a function of the relative humidity during replication.

Optimal replication appears to be obtained between 50 and 70% RH, which corresponds to a swelling of 15-40% (increase of film volume), as shown on FIG. 4. At this relative humidity, the patterns have the highest aspect ratios while keeping a good homogeneity.

Optimizing relative humidity during sol-gel imprinting thus allows obtaining structures with high aspects ratios (>1) and structures higher than 460 nm from an initial layer which is 90 nm high. This result is difficult to achieve with other techniques using soft conditions. Moreover, this process results in low thermal shrinkage of the structures (30% in each direction, 65% in volume) for $TiO_2$.

Example 2: Soft-NIL method applied to a $ZnO/TiO_2$ film and to a AlOOH film

Similarly to Example 1, a soft-NIL method was conducted on a $ZnO/TiO_2$ film. ZnO was mixed with $TiO_2$ to improve its processability and its chemical and mechanical properties and to reduce thermal shrinkage.

Three sol-gel solutions were prepared, respectively consisting of:

1.5 g $TiCl_4$, 1.75 g $Zn(OAc)_2,2H_2O$, 20.5 g ethanol, 1.62 g $H_2O$ and 0.1 g of Pluronic® F127 (PPG-PEG copolymer), to provide a 50:50 $ZnO:TiO_2$ film, 0.76 g $TiCl_4$, 2.63 g $Zn(OAc)_2,2H_2O$, 20.5 g ethanol, 1.62 g $H_2O$ and 0.1 g of Pluronic® F127 (PPG-PEG copolymer), to provide a 25:75 $ZnO:TiO_2$ film, and 5.1 g $Al(OiPr)_3$, 33.4 g ethanol, 3.42 g HCl (37%), 0.04 g CTAB (cetyl trimethylammonium bromide).

Each of these solutions was deposited onto a defatted glass slide (VWR®) by dip-coating in a controlled chamber (v=2 mm/s, T=25° C., RH=20%). Shortly after dip-coating, the glass slide was placed into a chamber with controlled atmosphere, onto a cold heating plate. The gas pressure was precisely controlled and maintained for 1 min, then the mould was applied onto the film and kept for 2 min under controlled humidity. This assembly was then heated to 120° C. for 5 min (including 2 min of heating time to 120° C.). The substrate was finally demoulded. In the case of $TiO_2$, it was further annealed at 350° C.

Figure 5:
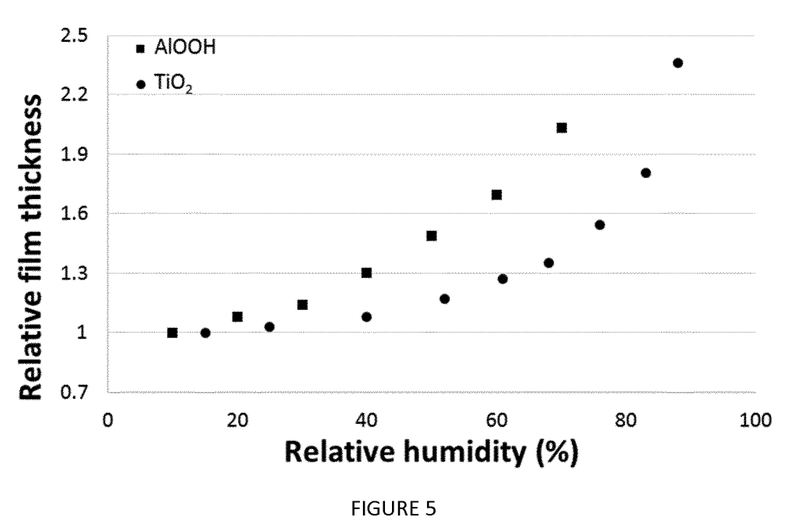
FIG. 5 illustrates the thickness variation of an aluminum oxide film as a function of the relative humidity during replication.
Figure 6:
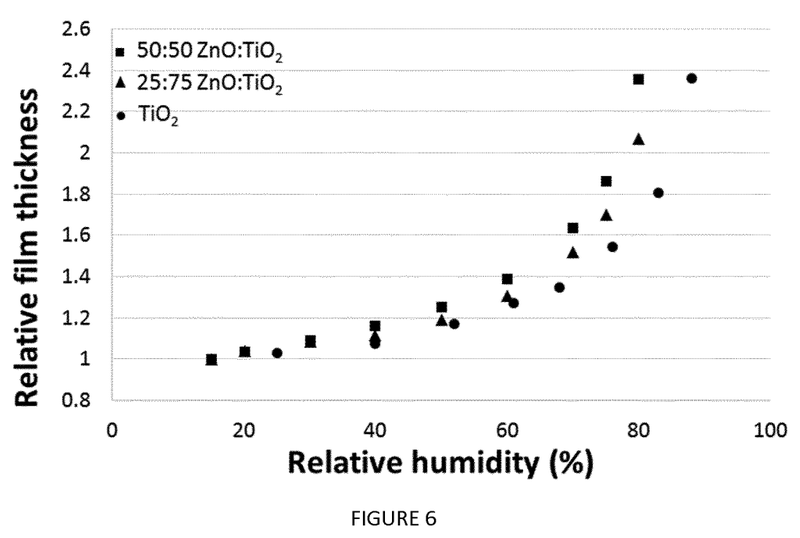
FIG. 6 illustrates the thickness variation of a $ZnO:TiO_2$ film as a function of the relative humidity during replication.

High quality replicas were obtained from the $ZnO:TiO_2$ films under 50% RH, which corresponds to a swelling rate of 20-30% vol., as shown on FIG. 6. In the case of the AlOOH film, replication was only possible between 20 and 50% RH, which corresponds to a swelling of 15-40% vol., as apparent on FIG. 5. Below 20% RH, no replication was observed, whereas the AlOOH film adhered to the mould during demoulding above 50% RH.

Example 3: Soft-NIL Process Under Controlled Atmosphere of Various Gases

A sol-gel solution consisting of TEOS (Aldrich):EtOH (absolute):$H_2O$(milliQ):Pluronic® F127 in a 1:20:5:0.0002 molar ratio was prepared and deposited onto a glass slide.

Figure 7:
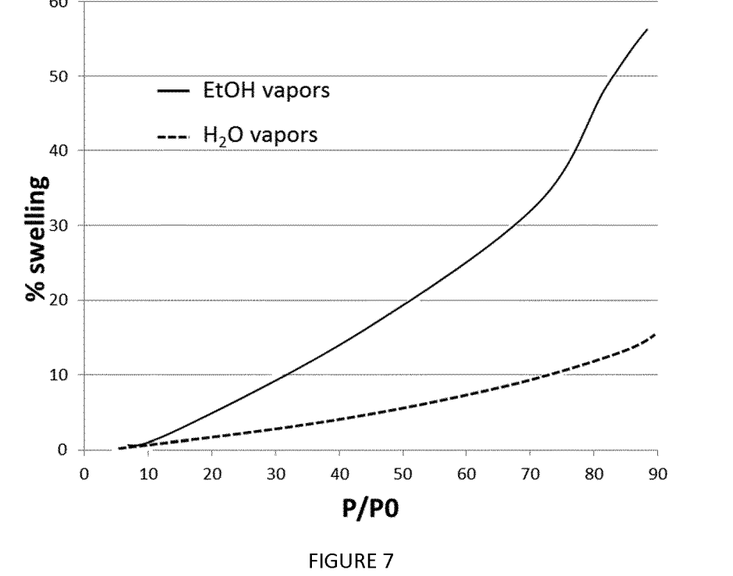
FIG. 7 shows the variation in the swelling of a $SiO_2$ film when varying the relative pressure two different solvents.

Various experiments were performed by varying the ethanol partial pressure in the chamber. As shown on FIG. 7, the swelling of the $SiO_2$ layer was higher in the case of ethanol, compared to the same partial pressure of water.

Example 4: Soft-NIL Method Applied to a Y—$ZrO_2$ Films and Hybrid-Silica Films

Similarly to Example 1, a soft-NIL method was conducted on Y—$ZrO_2$ films, hybrid silica films and $V_2O_5$ films. Hybrid silica refers to a gel containing standard silica precursor (here tetraethoxysilane) and a modified silica precursor (here methyltriethoxysilane). The addition of yttria in zirconia films allows to stabilize the cubic phase having better properties.

Sol-gel solution were prepared, consisting of:

0.94 $Zr(Cl)_4$; 0.06 $Y(NO_3)_3,2H_2O$; 41 EtOH; 12 $H_2O$; $2.10^{-4}$ F127 molar ratios for Yttria-stabilised zirconia precursor solution 0.6 TEOS; 0.4 MTEOS; 40 EtOH; 10 $H_2O$; 0.01 HCl; 0.01 CTAB molar ratios for hybrid silica.

1 $V(Cl)_3$; 60 EtOH: 10 $H_2O$; $2.10^{-4}$ F127 molar ratios for $V_2O_5$.

Each of these solutions was deposited onto a defatted glass slide (VWR®) by dip-coating in a controlled chamber (v=2 mm/s, T=25° C., RH=20%). Shortly after dip-coating, the glass slide was placed into a chamber with controlled atmosphere. The gas pressure was precisely controlled and maintained for 1 min, then the mould was applied onto the film and kept for 2 min under controlled humidity. This assembly was then heated to 70° C. for 1 min then 120° C. for 1 min. The substrate was finally demoulded and annealed at 400° C. for 10 min.

Figure 8:
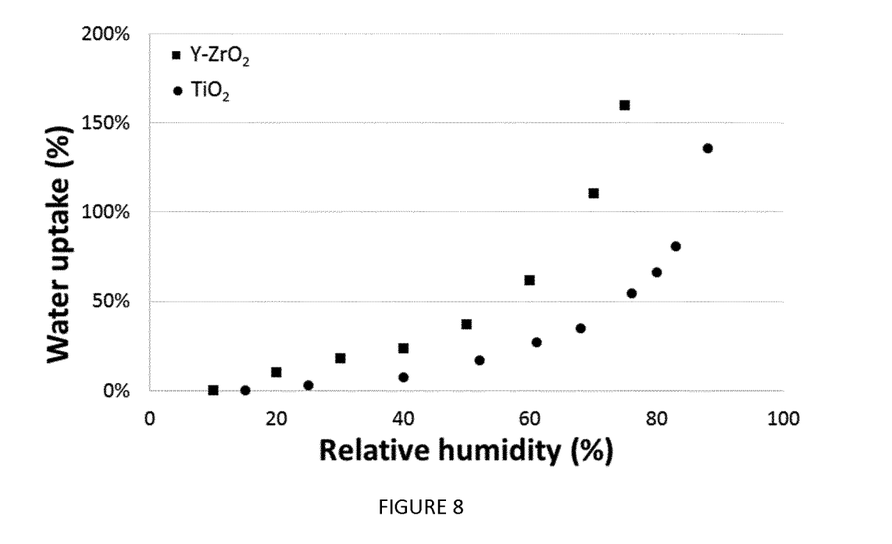
FIG. 8 shows the variation in water uptake of a $Y—ZrO_2$ film and a $TiO_2$ film as a function of the relative humidity during replication.

High quality replicas were obtained from the Y—$ZrO_2$ films under 50% RH, which corresponds to a water uptake of about 30% vol., as shown on FIG. 8.

Figure 9:
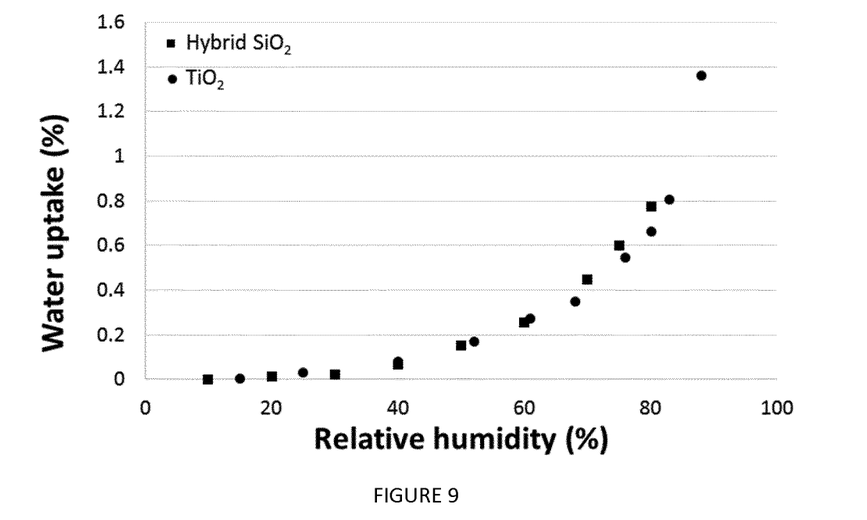
FIG. 9 shows the variation in water uptake of a hybrid $SiO_2$ film and a $TiO_2$ film as a function of the relative humidity during replication.

In the case of hybrid silica, replication yields high quality replicas at 70% RH which corresponds to a swelling rate of 20-30% vol as shown on FIG. 9.

Figure 10:
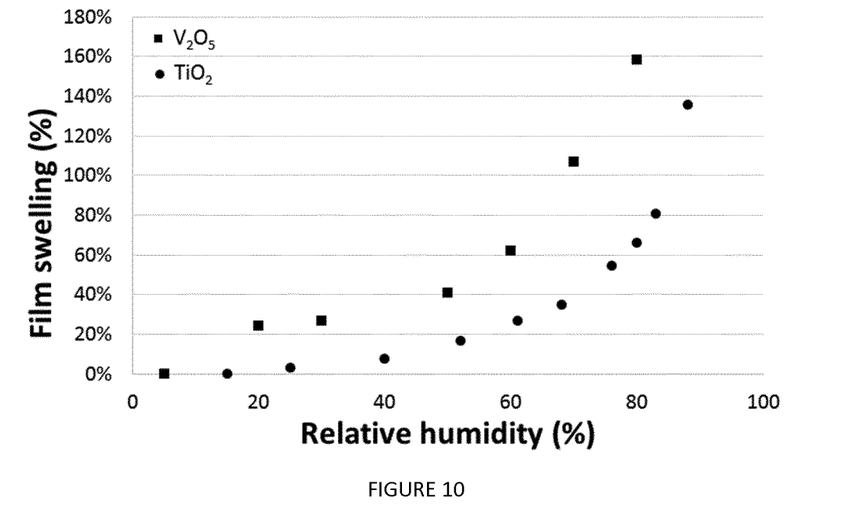
FIG. 10 shows the variation in the swelling of a $V_2O_5$ film and a $TiO_2$ film as a function of the relative humidity.

High quality replicas were obtained from the $V_2O_5$ films under 20% RH, which corresponds to a water uptake of 20-30% vol, as shown on FIG. 10. $V_2O_5$ can subsequently be reduced to $VO_2$ at 500° C. for 4 hours under an atmosphere composed of 5% of $H_2$ in $N_2$.

Example 5: Soft-NIL Method Applied to $TiO_2$ Nanoparticle Films

Similarly to Example 1, a soft-NIL method was conducted on $TiO_2$ nanoparticle films.

To do so, a sol-gel solution was prepared from:

0.04 mol/L of titanium isopropoxide in a 1:2 ethanol:water solvent. pH is adjusted at 0.7 by addition of concentrated $HNO_3$. The solution is stirred for 4 h at 240° C. (hydrothermal conditions) to yield 15 nm diameter $TiO_2$ nanoparticles.

The ageing of the solution allows to deposit nanoparticles instead of small clusters as in Example 1.

The solution is deposited onto a defatted glass slide (VWR®) by dip-coating in a controlled chamber (v=2 mm/s, T=25° C., RH=20%). Shortly after dip-coating, the glass slide was placed into a chamber with controlled atmosphere. The gas pressure was precisely controlled and maintained for 1 min, then the mould was applied onto the film and kept for 2 min under controlled humidity. This assembly was then heated to 70° C. for 1 min then 120° C. for 1 min. The substrate was finally demoulded.

Figure 11:
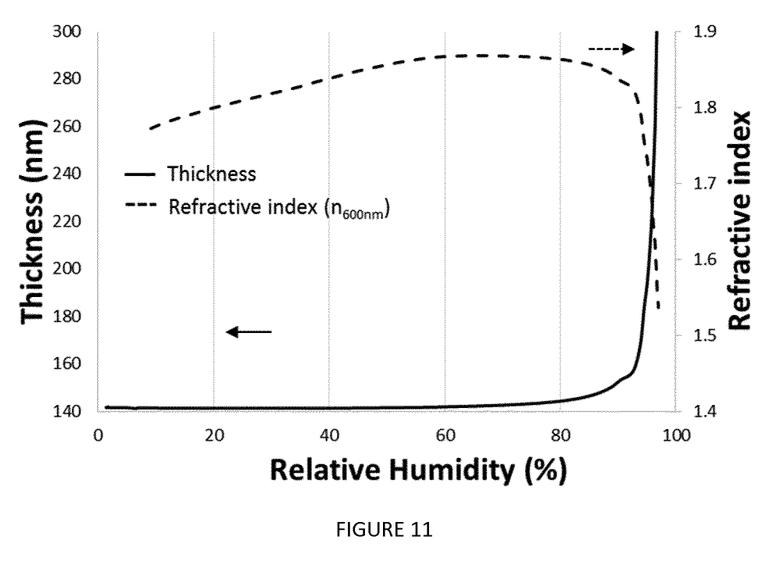
FIG. 11 illustrates the thickness and refractive index variations of a $TiO_2$ film as a function of the relative humidity during replication.

High quality replicas were obtained from the $TiO_2$ nanoparticle films under 95% RH, which corresponds to a water uptake of about 30% vol., as shown on FIG. 11.

The invention claimed is:

1. A nanoimprint lithography (NIL) process, comprising the successive steps of:
    a) preparing a solution of sol-gel metal or metalloid oxide precursor(s),
    o) performing a calibration step to determine solvent relative pressure that should be applied during replication step d,
    b) applying said solution onto a substrate to form a film,
    c) equilibrating the film with the atmosphere under adjusted solvent vapor pressure, to obtain a gel film,
    d) applying a soft mould onto said gel film to provide an assembly such that said gel film fills up the cavities of the mould, and maintaining said assembly under solvent vapor,
    e) thermally treating said assembly so as to rigidify the gel film thus obtained,
    f) removing the mould to obtain a substrate coated with a patterned gel, and
    g) curing said patterned gel so as to obtain a patterned metal or metalloid oxide material on said substrate,
    wherein the solvent uptake of the film is adjusted to 10 to 50% volume by varying the vapor pressure in a volatile solvent at the vicinity of the film and gel film during steps c) and d) and wherein the gel film does not comprise organic polymers.

2. The process according to claim 1, wherein the thermal treatment is performed at a temperature of from 25 to 200° C.

3. The process according to claim 1, wherein the curing step is performed at a temperature of from 200 to 800° C.

4. The process of claim 1, wherein the solvent uptake of the film is adjusted between 15 and 40% vol.

5. The process of claim 1, wherein the step of applying said solution onto a substrate to form a film is performed at a relative humidity of 20%.

6. The process of claim 1, wherein the solvent is selected from the group consisting of water, ethanol, isopropanol, acetone, THF, hexane, toluene and their mixtures.

7. The process of claim 6, wherein the solvent is water.

8. The process according to claim 1, wherein the metal or metalloid oxide precursors are selected from the group consisting of inorganic salts, organics salts or alkoxides of at least one metal or metalloid or of a combination of at least one metal with at least one metalloid.

9. The process according to claim 8, wherein that the metal or metalloid oxides obtained from the metal or metalloid oxide precursors are selected from the group consisting of $TiO_2$, $ZnO:TiO_2$, $AlO(OH)$, $V_2O_5$, $VO_2$, silicon oxides and $Y-ZrO_2$.

10. The process according to claim 1, wherein the mould is manufactured from silicone elastomers, fluorinated polymers, polyvinylpyrrolidone (PVP), polylactic acid (PLA) or polyetherimide (PEI).

11. The process of claim 10, wherein the mould is manufactured from silicone elastomers.

12. A patterned substrate obtainable by the process according to claim 1.

13. A device for optical, photonic, electrical or biological applications comprising a patterned substrate according to claim 12.

14. A nanoimprint lithography (NIL) process, comprising the successive steps of:
   a) preparing a solution of sol-gel metal or metalloid oxide precursor(s),
   o) performing a calibration step to determine the solvent relative pressure that should be applied during replication step d,
   a') converting the metal or the metalloid oxide precursors into the metal or the metalloid oxide suspension,
   b) applying said solution onto a substrate to form a film,
   c) equilibrating the film with the atmosphere under adjusted solvent vapor pressure, to obtain a gel film,
   d) applying a soft mould onto said gel film to provide an assembly such that said gel film fills up the cavities of the mould, and maintaining said assembly under solvent vapor,
   e) thermally treating said assembly so as to rigidify the gel film thus obtained, and
   f) removing the mould to obtain a substrate coated with a patterned gel, wherein the solvent uptake of the film is adjusted to 10 to 50% volume by varying the vapor pressure in a volatile solvent at the vicinity of the film and gel film during steps c) and d), and wherein the gel film does not comprise organic polymers.

15. The process of claim 14, further comprising, after step f), a step g) of curing said patterned gel so as to obtain a patterned metal or metalloid oxide material on said substrate.

* * * * *